(12) United States Patent
Yang (10) Patent No.: US 9,854,673 B2
(45) Date of Patent: Dec. 26, 2017

(54) GRIPS TO RETAIN FASTENERS FOR EXPANSION CARDS

(71) Applicant: Hewlett-Packard Development Company, L.P., Houston, TX (US)

(72) Inventor: Cheng-Yi Yang, Taipei (TW)

(73) Assignee: Hewlett-Packard Development Company, L.P., Houston, TX (US)

( * ) Notice: Subject to any disclaimer, the term of this patent is extended or adjusted under 35 U.S.C. 154(b) by 6 days.

(21) Appl. No.: 15/025,109

(22) PCT Filed: Sep. 27, 2013

(86) PCT No.: PCT/US2013/062178
§ 371 (c)(1),
(2) Date: Mar. 25, 2016

(87) PCT Pub. No.: WO2015/047299
PCT Pub. Date: Apr. 2, 2015

(65) Prior Publication Data
US 2016/0249455 A1    Aug. 25, 2016

(51) Int. Cl.
*H05K 1/14* (2006.01)
*F16B 39/00* (2006.01)
*G06F 1/18* (2006.01)
*F16B 37/04* (2006.01)

(52) U.S. Cl.
CPC ............ *H05K 1/141* (2013.01); *F16B 37/043* (2013.01); *F16B 39/00* (2013.01); *G06F 1/185* (2013.01)

(58) Field of Classification Search
CPC ...... F16B 5/0208; F16B 37/04; F16B 37/041; F16B 37/043; F16B 39/00

USPC .................................................. 411/103, 107
See application file for complete search history.

(56) References Cited

U.S. PATENT DOCUMENTS

| 3,449,004 A | * | 6/1969 | Anderson | F16B 5/0208 403/408.1 |
| 3,640,327 A | * | 2/1972 | Burt | F16B 5/02 411/108 |
| 4,952,107 A | * | 8/1990 | Dupree | F16B 41/002 411/103 |

(Continued)

FOREIGN PATENT DOCUMENTS

| CN | 2840148 Y | 11/2006 |
| CN | 200972909 | 11/2007 |

(Continued)

OTHER PUBLICATIONS

PCT International Search Report and Written Opinion, dated Jun. 24, 2014, PCT Patent Application No. PCT/US2013/062178, Hewlett-Packard Development Company, L.P., Korean Intellectual Property Office, 9 pages.

*Primary Examiner* — Roberta S Delisle
(74) *Attorney, Agent, or Firm* — HP Inc. Patent Department (57) ABSTRACT

An example device in accordance with an aspect of the present disclosure includes a grip to secure the device to an expansion card. The grip includes an upper grip portion to receive a fastener, and a standoff formed by a lower grip portion. The standoff is to establish a standoff distance between the expansion card and the mainboard when the device is secured to the expansion card and fastened to the mainboard.

15 Claims, 7 Drawing Sheets

(56) References Cited

U.S. PATENT DOCUMENTS

| | | | | |
|---|---|---|---|---|
| 4,964,594 A | * | 10/1990 | Webb | B64C 1/12 |
| | | | | 244/129.3 |
| 5,563,770 A | | 10/1996 | Bethurum | |
| 6,394,724 B1 | * | 5/2002 | Kelly | F16B 41/002 |
| | | | | 411/107 |
| 7,283,368 B2 | * | 10/2007 | Wung | H01L 23/4093 |
| | | | | 165/185 |
| 8,511,956 B2 | * | 8/2013 | Liu | F16B 5/0266 |
| | | | | 411/107 |
| 8,573,911 B2 | * | 11/2013 | Degner | G06F 1/1613 |
| | | | | 312/223.2 |
| 2003/0077925 A1 | | 4/2003 | Cermak, III et al. | |
| 2006/0003608 A1 | | 1/2006 | Sandoval et al. | |
| 2007/0105425 A1 | | 5/2007 | Wang | |
| 2009/0185356 A1 | | 7/2009 | Liao et al. | |
| 2010/0033942 A1 | | 2/2010 | Yang et al. | |
| 2010/0315774 A1 | | 12/2010 | Walker et al. | |
| 2011/0228462 A1 | | 9/2011 | Dang | |
| 2014/0328644 A1 | * | 11/2014 | McCorkell | B60J 5/0468 |
| | | | | 411/107 |

FOREIGN PATENT DOCUMENTS

| | | |
|---|---|---|
| CN | 202615276 | 12/2012 |
| DE | 20302264 U1 | 5/2003 |
| JP | 2009-116771 | 5/2009 |
| TW | M323733 | 12/2007 |

\* cited by examiner

| 'A'(mm) | | |
|---|---|---|
| TYPE | NOMINAL | TOL |
| 2230 | 30.00 | ±0.15 |
| 2242 | 42.00 | ±0.15 |
| 2260 | 60.00 | ±0.15 |
| 2280 | 80.00 | ±0.15 |
| 22110 | 110.0 | ±0.15 |

GRIPS TO RETAIN FASTENERS FOR EXPANSION CARDS

CROSS-REFERENCE TO RELATED APPLICATION

This application is a U.S. National Stage Application of and claims priority to International Patent Application No. PCT/US2013/062178, filed on Sep. 27, 2013, and entitled "GRIPS TO RETAIN FASTENERS FOR EXPANSION CARDS," which is hereby incorporated by reference in its entirety.

BACKGROUND

Expansion cards may be mounted to a mainboard using a standoff. The standoff may protrude at mounting holes of the mainboard. A mainboard that supports expansion cards of different lengths may need a plurality of standoffs protruding from the mounting holes.

Captive Fastener Design

Shaft allows play/tolerance for the fastener to slide up and down along the shaft axis.

DETAILED DESCRIPTION

Examples provided herein include a device to mount multi-length expansion cards at a mainboard (e.g., printed circuit board assembly (PCBA)). The device may include a fastener captively retained at a grip, to retain the fastener on the expansion card regardless of the expansion card length. The device may be used on various types of expansion cards, such as Next Generation Form Factor (NGFF) expansion cards including M.2 form factors and other form factors to provide storage devices and other devices. The device enables the mounting hole at the mainboard to remain flat, because the device provides a standoff for properly aligning the expansion card, without a need for a protruding standoff to be used at the mainboard. The device may combine a fastener, such as a screw, with a standoff and fastener retainer. The device may be attached to the expansion card, and the device/card assembly may be mounted to the mainboard. The device may be attached to the expansion card based on a snap-on friction fit. The device may address multiple issues, including heat transfer, electrical grounding, and accommodating different lengths of the expansion card.

Figure 1:
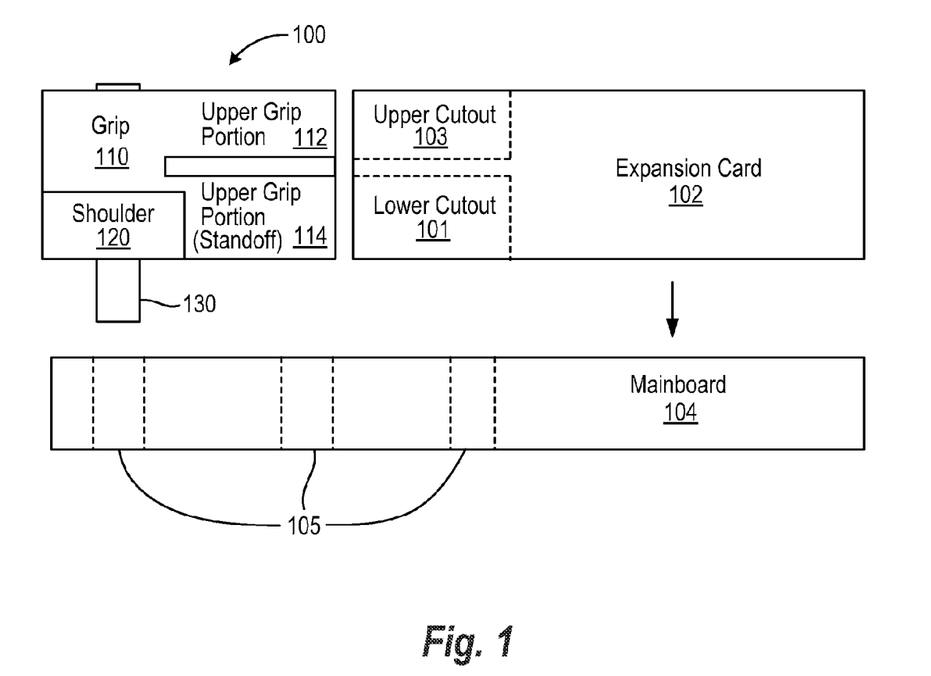
FIG. 1 is a block diagram of a device including an upper grip portion and lower grip portion according to an example.

FIG. 1 is a block diagram of a device 100 including an upper grip portion 112 and lower grip portion 114 according to an example. The upper and lower grip portions 112, 114 may be associated with the grip 110. The grip 110 may be coupled with a shoulder 120 and a fastener 130. The grip 110 is to be mounted to the expansion card 102, e.g., based on the upper and lower grip portions 112, 114 engaging the upper and lower cutouts 103, 101 of the expansion card 102. The lower grip portion 114 may serve as a standoff for mounting the expansion card 102 at an appropriate spacing from the mainboard 104. The fastener 130 of the device 100 is to be fastened to a mounting hole 105 of the mainboard 104 corresponding to a length of the expansion card 102.

Grip 110 enables the device 100 to snap onto the end of the expansion card 102, and may be based on a spring-loaded grip to retain the device 100 onto the expansion card 102. The grip 110 includes upper grip portion 112 and lower grip portion 114, and may be electrically insulating. In an example, the grip 110 and upper/lower grip portions 112, 114 may be made of plastic, or other suitable material that can form a spring action based on the upper/lower grip portions 112, 114. The upper/lower grip portions 112, 114 are shown having a pronged-like extension, although other gripping configurations are possible.

The lower grip portion 114 may serve as a standoff, in addition to serving as a friction grip to retain the device 100 on the expansion card 102. The lower grip portion 114 enables the expansion card to be maintained at a proper distance from the mainboard 104, e.g., parallel to the mainboard 104. Furthermore, the device 100 is to ensure that the fastener 130 is aligned with a mounting hole 105 of the mainboard 104, when the device 100 is mounted to the end of an expansion card 102 of corresponding length.

The shoulder 120 is to provide various benefits, including electrically/thermally connecting the expansion card 102 to the mainboard 104, and retaining the fastener 130 in the device 100. The shoulder 120 may be made of metal for heat transfer and electrical grounding, such as copper. The shoulder 120 may provide a captive fastener feature, by preventing the fastener 130 from falling out of the device 100. The shoulder 120 may be provided as an insert into the grip 110, which may be a loose fit or a friction/interference fit. In an example, the shoulder 120 is loosely retained at the grip 110 based on the fastener retention feature of the shoulder 120 and fastener 130 sandwiching the shoulder 120 onto the grip 110.

The mounting hole 105 may be threaded to receive the fastener 130, enabling the device 100 to fasten the expansion card 102 onto the mainboard 104. The fastener 130 may be a standard screw design (e.g., used in other mounting components of a mainboard 104), and may be modified for compatibility with the captive fastener feature of the shoulder 120.

In use, the grip 110 may be slid onto the end of the expansion card 102 such that at least a portion of the expansion card 102 extends into the device 100 to come in contact with the shoulder 120. The assembly of the device 100 and the expansion card 102 may be inserted into a corresponding connector at the mainboard 104, and pivoted into place so that the fastener 130 aligns with a mounting hole 105. The mounting hole 105 may be threaded, or rely on other receiving techniques corresponding to the fastener 130. In an example, the mounting hole 105 may include a threaded insert, that is metal and electrically grounded. Accordingly, the fastener 130 may be secured to the mounting hole 105, enabling the shoulder 120 to come in contact with the mounting hole 105 and corresponding grounded insert. Thus, the shoulder 120 completes an electrical and thermal connection between the expansion card 102 and the grounded mounting hole 105 of the mainboard 104. The fastener 130 also may contribute to the electrical and thermal connection, although the fastener 130 may be made of a material chosen for mechanical strength (e.g., steel), in contrast to the shoulder 120 that may be chosen for electrical and thermal properties (e.g., copper).

Figures 2A, 2B:
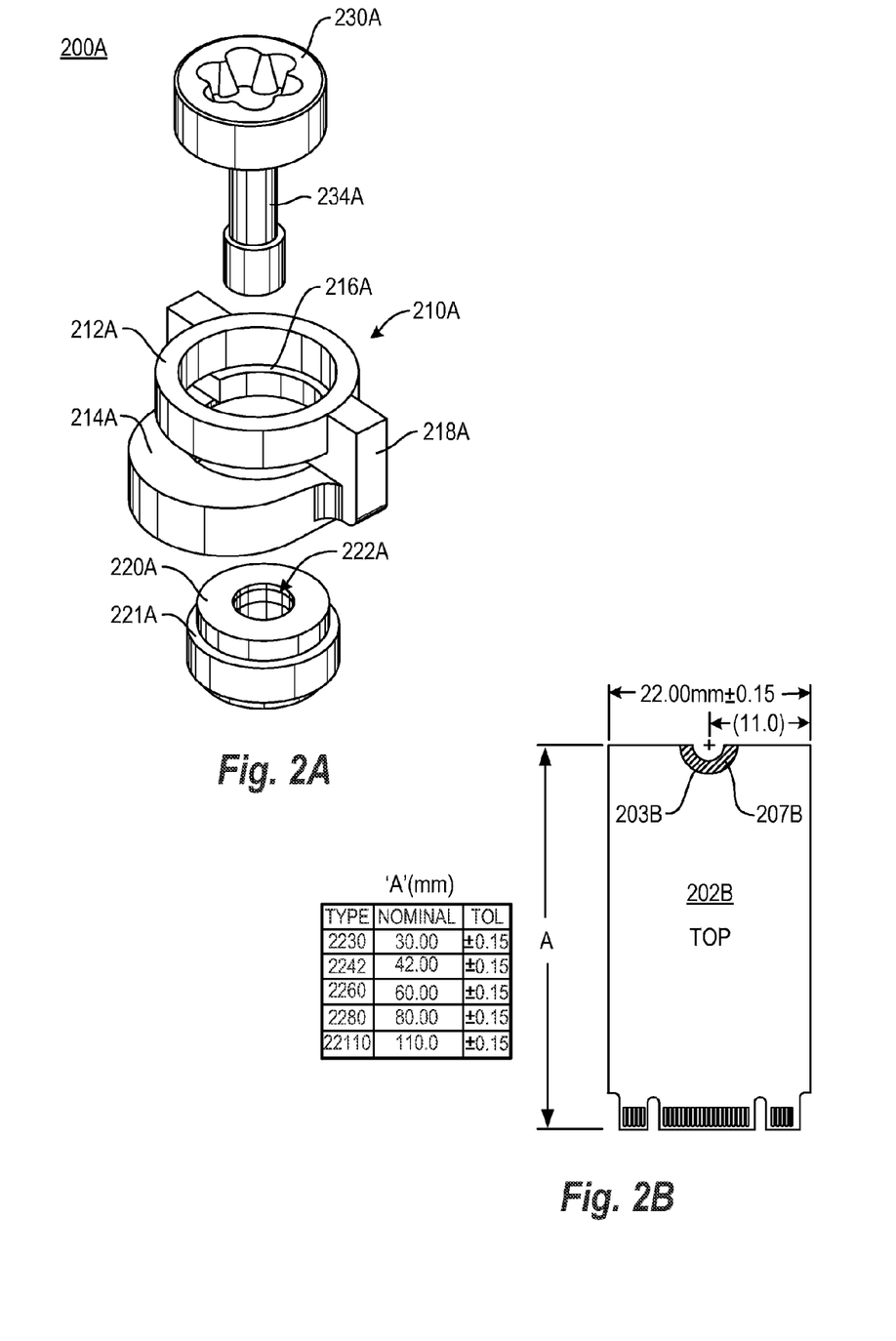
FIG. 2A is a top perspective exploded view of a device including an upper grip portion and lower grip portion according to an example.
FIG. 2B is a top view of an expansion card to be gripped by a device according to an example.

FIG. 2A is a top perspective exploded view of a device 200A including an upper grip portion 212A and lower grip portion 214A according to an example. The fastener 230A is shown aligned with the grip 210A, which is aligned with the shoulder 220A. The fastener 230A includes a fastener shaft 234A. The grip 210A includes the upper/lower grip portions 212A, 214A, aligner 218A, and shelf 216A.

The fastener 230A is shown as a screw that may be formed of heat-treated steel or other suitable metal to provide an acceptable fastening force. In an example, the screw is an M 1.6 mm, whose shaft 234A has a diameter of 1.6 mm at the longest extent, a shaft length of 5 mm (measured from an underside of the screw head to the end of the tip of the shaft 234A including its taper). The shaft 234A includes a thinner shaft portion, having a reduced diameter of 1.2 mm. A total length of the screw is 7 mm. The length of the shaft 234A corresponding to the thinner diameter is 3.2 mm. The screw may be received into the upper portion of the grip 210A, e.g., within the upper grip portion 212A.

The grip 210A may include a shelf 216A. The shelf 216A may receive and stabilize the head of the fastener 230A, providing support for a portion of the fastener head corresponding to the portion that faces away from the expansion card (e.g., supporting a portion of the fastener that is not in contact with the expansion card). The shelf 216A is shown encircling approximately a semicircular portion of the inside of the grip 210A opposite the upper grip portion 212A. The semicircle terminates at the aligners 218A.

The aligner 218A provides ease of use, making it easier to handle the device 200A, and facilitating proper insertion of the device 200A onto the expansion card. The aligner 218A provides a flush surface for contacting the edge of the expansion card, and helping to guide rotation of the device 210A into proper alignment.

The shoulder 220A includes a captive orifice 222A to receive the fastener 230A passing through the grip 210A, to capture the fastener 230A and retain the fastener 230A and shoulder 220A with the grip 210A. In an example, the shoulder 220A and fastener 230A are dimensioned to enable a snap-together assembly that is spring loaded, such that the fastener 230A remains captured unless a large amount of force is exerted to disassemble the shoulder 220A and fastener 230A.

The shoulder 220A may be inserted up into the grip 210A. A shoulder shelf 221A may correspond to the grip shelf 216A, so that the shoulder 220A can be properly seated up against the shelf 216A and flush with a bottom of the lower grip portion 214A. A portion of the shoulder 220A also may protrude upward for positioning with contact with the expansion card. The heat transferring and electrically conducting features of the shoulder 220A provide desirable benefits to the expansion card, e.g., where the card generates heat and improves performance when grounded. In an alternate example, the various components may be made of other materials, such as a thermally and/or electrically insulating material such as ceramic.

FIG. 2B is a top view of an expansion card 202B to be gripped by a device according to an example. The expansion card is shown having an upper cutout 203B, which may differ from a lower cutout on a bottom side of the expansion card (not shown in FIG. 2B). The cutout areas are vacant portions not occupied by a thickness of the components on a top or bottom surface of the expansion card. The expansion card also includes a mechanical ground pad 207B, which may come in contact with the device of FIG. 2A for electrical and thermal grounding.

Example devices described herein may be compatible with mounting the expansion card 202B shown in FIG. 2B. The expansion card 202B may include single and double-sided modules, to expand the capabilities of devices such as notebooks, ultrabooks, desktops, tablets, servers, portable gaming devices, devices that use storage (such as solid state disks, or SSDs), portable mobile devices such as smartphones and global positioning systems (GPS), and the like.

The expansion card 202B may be various types of form factors, to receive the example devices provided herein to mount the expansion card. In an example, the expansion card 202B may be a next generation form factor (NGFF), such as an M.2 card, but also may include other form factors such as a mini card, a half mini card, and other even smaller (size and/or volume) form factors.

The dimensions of the expansion card 202B may vary. To accommodate components on a top side component area and a bottom side component area, the thickness of the expansion card 202B may increase. Similarly, a length A of the expansion card 202B may vary. As illustrated, the measurement for length A in millimeters (mm) may be 30, 42, 60, 80, and 110 mm (plus or minus 0.15 mm), depending on the size of the expansion card. Thus, the example devices provided herein may enable mounting of any length of expansion card, because the device connects onto the end of the expansion card at the mechanical ground pad 207B, thereby aligning with a corresponding mounting hole at the mainboard.

Figure 3A:
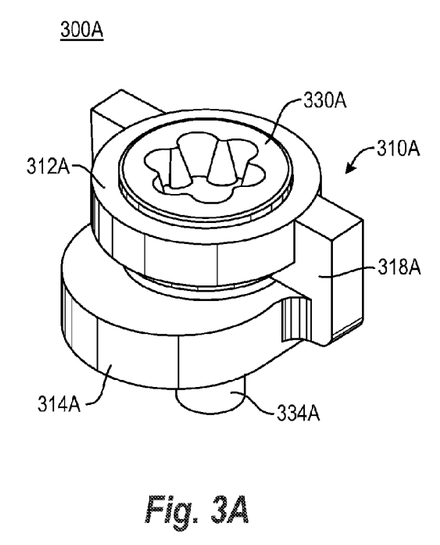
FIG. 3A is a top perspective view of a device including an upper grip portion and lower grip portion according to an example.

FIG. 3A is a top perspective view of a device 300A including an upper grip portion 312A and lower grip portion 314A according to an example. The device 300A also includes fastener 330A, grip 310A, aligner 318A, and shaft 334A. The device 300A is shown assembled as a unit, whereby the fastener is captively retained in the device 300A, and the device is ready to be attached onto an expansion card. Such assembled devices 300A may be provided as fasteners, e.g., to a computer assembly line, to be used in place of a bare fastener such as a screw.

Figure 3B:
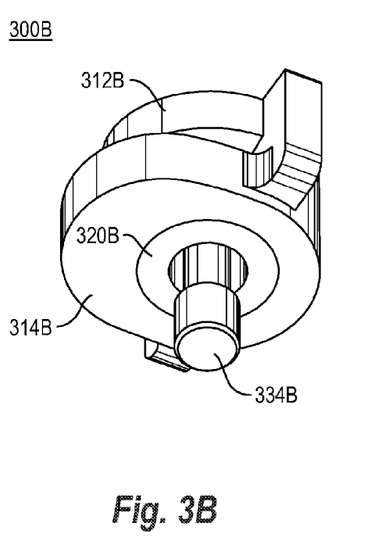
FIG. 3B is a bottom perspective view of a device including an upper grip portion and lower grip portion according to an example.

FIG. 3B is a bottom perspective view of a device 300B including an upper grip portion 312B and lower grip portion 314B according to an example. The underside view reveals the flush positioning of the shoulder 320B within the lower grip portion 314B. Further, the fastener shaft 334B is shown extending through the shoulder 320B. A reduced-diameter portion of the shaft 334B is aligned near the shoulder 320B, enabling the shaft 334B to have some play/tolerance. For example, the fastener may slide side-to-side, be swept along an angular deflection in any direction, and may slide up and down along the axis of the shaft 334B. Accordingly, the fastener is provided with a blind-mate functionality, in that the device 300B may conveniently align the fastener above a corresponding mounting hole, and the fastener may be actuated to push the fastener into the hole and secure the fastener to the mainboard without a need to visually check for alignment.

Figure 3C:
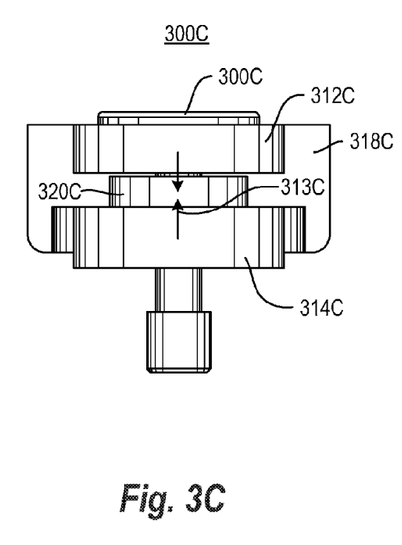
FIG. 3C is a front view of a device including an upper grip portion and lower grip portion according to an example.

FIG. 3C is a front view of a device 300C including an upper grip portion 312C and lower grip portion 314C according to an example. The device 300C also includes a fastener 330C and aligner 318C. A portion of the assembled shoulder 320C is shown exposed through the gap formed by the upper/lower grip portions 312C, 314C (e.g., to contact the mechanical ground pad of the expansion card). The upper/lower grip portions 312C, 314C are to provide a spring force 313C. Accordingly, the upper/lower grip portions 312C, 314C may grip the expansion card, and provide a friction fit to secure the device 300C to the end of the expansion card. A profile of the upper/lower grip portions 312C, 314C may be shaped to increase or decrease the generated spring force 313C to adjust the grip strength as desired (e.g., in view of the springiness of the materials, fragility of the expansion card, etc.). The spring force 313C may be augmented by the operation of the fastener 330C, e.g., to reinforce or otherwise urge the upper grip portion 312C toward the lower grip portion 314C.

The front view of device 300C illustrates how the upper/lower grip portions 312C, 314C have different dimensions. As shown, the lower grip portion 314C is of greater thickness than the upper grip portion 314C, to provide an appropriate standoff distance that the expansion card may rest upon and use to align with the mainboard. The shoulder is not shown protruding below the lower grip portion 314C, and may be flush with (or shallower than) a surface of the lower grip portion 314C to avoid interfering with the standoff operation (and/or enhancing it, by providing a metal core support to serve as a metal standoff in conjunction with the plastic standoff of the lower grip portion 314C).

Figure 3D:
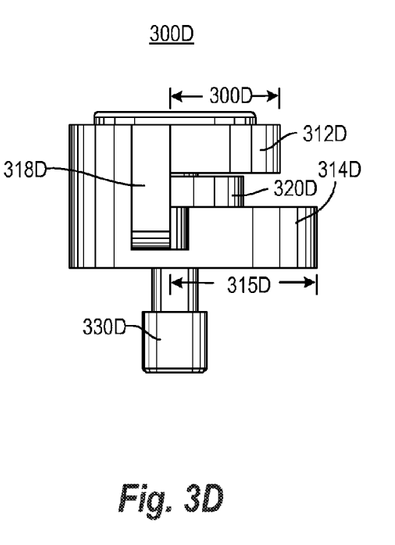
FIG. 3D is a side view of a device including an upper grip portion and lower grip portion according to an example.

FIG. 3D is a side view of a device 300D including an upper grip portion 312D and lower grip portion 314D according to an example. The device 300D includes aligner 318D and fastener shaft 330D. The upper/lower grip portions 312D, 314D are shown in side profile, illustrating their correspondingly different upper radius 311D and lower radius 315D. Such differing radii may correspond to different upper/lower cutouts in the expansion card. Additionally, the aligner 318D is visibly aligned to serve as a stop for butting up against the end of the expansion card, enabling the expansion card to contact/merge with surfaces of the upper grip portion 312D, shoulder 320D, lower grip portion 314D, and face of the aligner 318D.

Figure 4A:
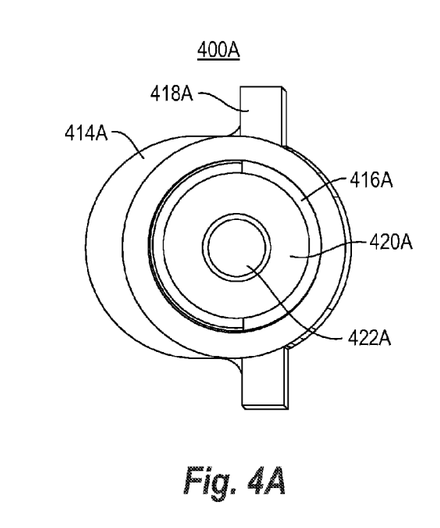
FIG. 4A is a top view of a device including a shelf according to an example.

FIG. 4A is a top view of a device 400A including a shelf 416A according to an example. The fastener is not visible in the views of FIGS. 4A-4D, revealing additional details. The aligner 418A is shown providing a flush surface in conjunction with the shelf 416A. The lower grip portion 414A is shown visibly protruding. The shoulder 420A is also visible, including a captive orifice 422A to captively receive the fastener.

Figure 4B:
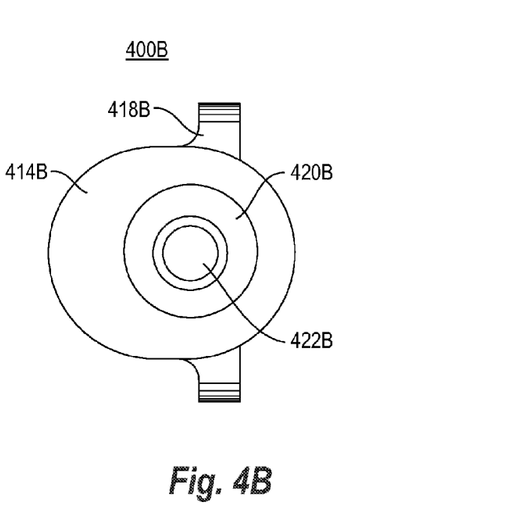
FIG. 4B is a bottom view of a device including a shoulder according to an example.

FIG. 4B is a bottom view of a device 400B including a shoulder 420B according to an example. Similar to the top view, the captive orifice 422B is visible. A curved portion of the aligners 418B is visible to provide additional reinforcement to the aligners 418B. However, such curved portions do not interfere with the aligner's ability to provide a flush surface to engage the edge of the expansion card.

Figure 4C:
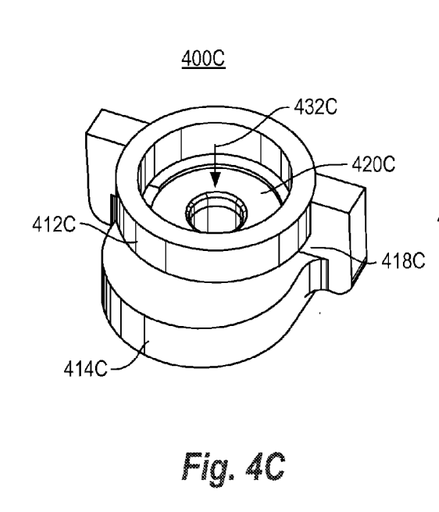
FIG. 4C is a top perspective view of a device including a shoulder according to an example.

FIG. 4C is a top perspective view of a device 400C including a shoulder 420C according to an example. The shoulder 420C is shown roughly flush with the shelf, providing a combined surface to support the fastening force 432C. Furthermore, the shoulder 420C is shown at an approximate size that would correspond with a fastener head to generate the fastening force 432C. A flush surface portion of the aligner 418C is shown, exposed between the upper/lower gripping portions 412C, 414C.

Figure 4D:
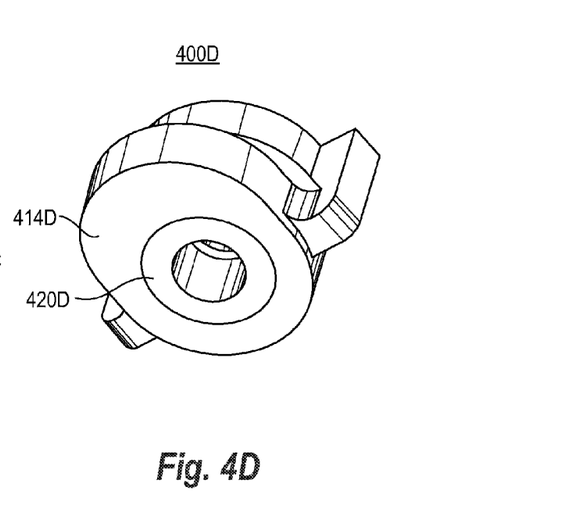
FIG. 4D is a bottom perspective view of a device including a shoulder according to an example.

FIG. 4D is a bottom perspective view of a device 400D including a shoulder 420D according to an example. Additional features are revealed, consistent with the other similar features as described herein.

Figure 5A:
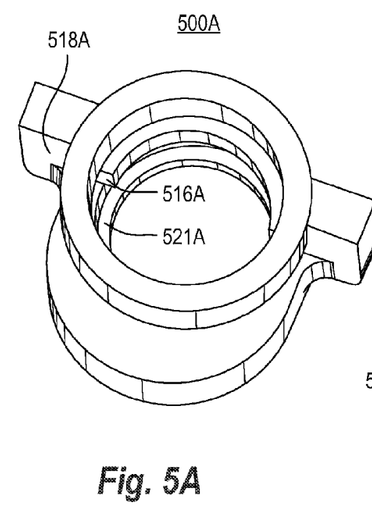
FIG. 5A is a top perspective view of a device including a shelf according to an example.

FIG. 5A is a top perspective view of a device 500A including a shelf 516A according to an example. The fastener and the shoulder are not visible in the views of FIGS. 5A-5D, revealing additional details. The aligner 518A is shown flush with the shelf 516A. Further, a lower shelf 521A is shown, which may be used to align/stabilize a shoulder (not shown in FIG. 5A) to be inserted in the device 500A.

Figure 5B:
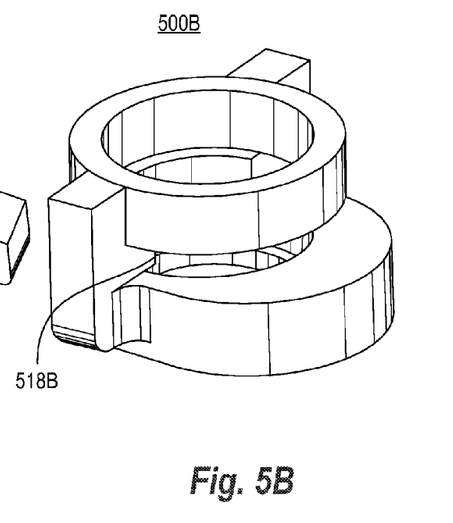
FIG. 5B is a side perspective of a device including an aligner according to an example.

FIG. 5B is a side perspective of a device 500B including an aligner 518B according to an example. The view of FIG. 5B reveals additional details, such as the portion of the aligner 518B extending between upper/lower grip portions.

Figure 5C:
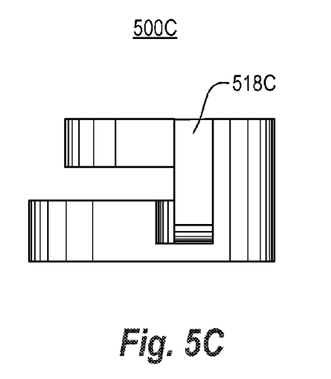
FIG. 5C is a side view of a device including an aligner according to an example.

FIG. 5C is a side view of a device 500C including an aligner 518C according to an example. The side view reveals the flush and perpendicular nature of the edges provided by the device 500C.

Figure 5D:
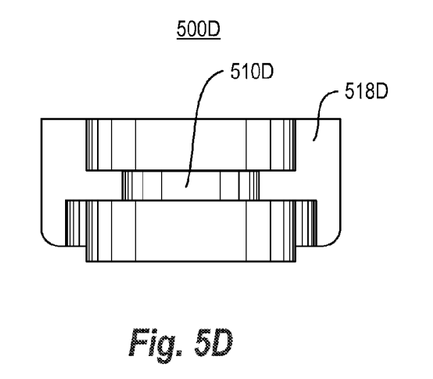
FIG. 5D is a front view of a device including an aligner according to an example.

FIG. 5D is a front view of a device 500D including an aligner 518D according to an example. A rear wall of the grip 510D is visible between the gap of the upper/lower grip portions.

Figure 6A:
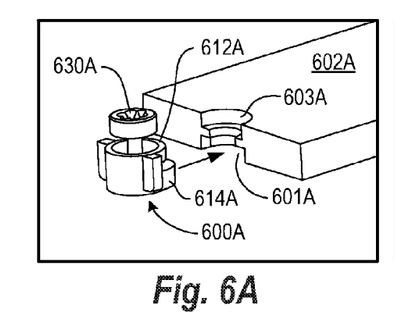
FIG. 6A is a perspective view of a device interfacing with an expansion card according to an example.

FIG. 6A is a perspective view of a device 600A interfacing with an expansion card 602A according to an example. The fastener 630A is shown in a position that is still captive in the device 600A, but elevated within the tolerance of movement provided by the fastener shaft and shoulder interaction. From this angle, the lower grip portion is visibly protruding further than the upper grip portion, corresponding to the differing dimensions of the upper cutout 603A and lower cutout 601 of the expansion card 602A. The upper/lower grip portions 612A, 614A may fully fill the space afforded by the expansion card, providing positive and enhanced contact between the device 100 and the expansion card, ensuring a secure grip, while still enabling the fastener 630A to contact the expansion card (e.g., at the mechanical ground pad of the expansion card). The device 600A may be engaged onto the expansion card 602A by moving in the direction of the arrow.

Figure 6B:
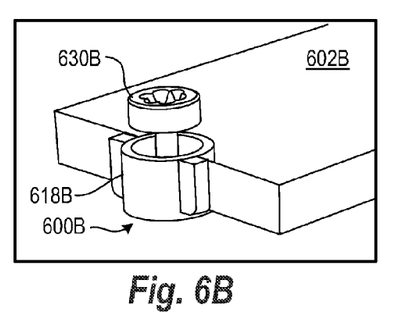
FIG. 6B is a perspective view of a device interfacing with an expansion card according to an example.

FIG. 6B is a perspective view of a device 600B interfacing with an expansion card 602B according to an example.

The device 600B is shown engaging the expansion card 602B, and the fastener 630B is shown elevated/disengaged (but still captively retained at the device 600B). The curved gripping portions are engaged with the expansion card 602B, just as the flush surfaces of the aligners 618B (and a curved side surface of the shoulder between the gripping portions is engaged with the mechanical ground pad, not visible in FIG. 6B).

Figure 6C:
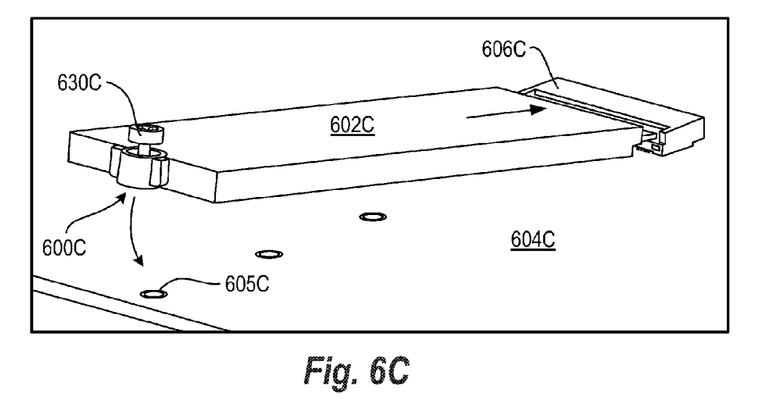
FIG. 6C is a perspective view of a device interfacing with an expansion card and mainboard according to an example.

FIG. 6C is a perspective view of a device 600C interfacing with an expansion card 602C and mainboard 604C according to an example. An electrical interface of the expansion card has been inserted into card slot 606C of the mainboard 604C. The device 600C has aligned the fastener 630C with the furthest mounting hole 605C of the mainboard 604C. Although three mounting holes 605C are shown, additional or fewer holes may be provided in alternate examples. The expansion card 602C will be pivoted down, such that the device 600C may provide a standoff function to protect the expansion card and ensure proper alignment.

Figure 6D:
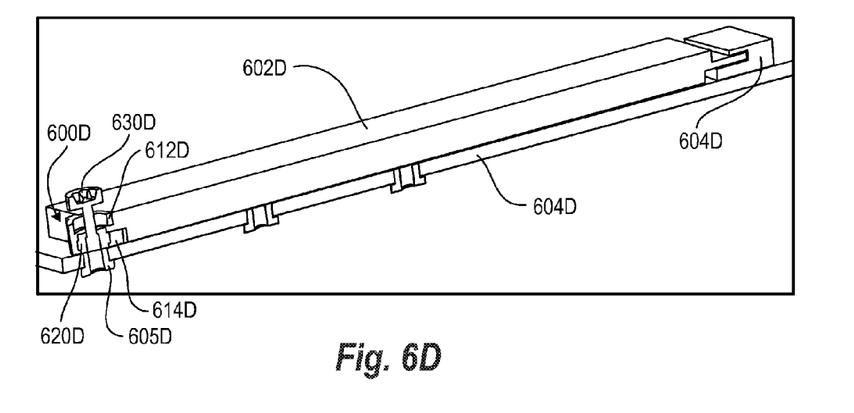
FIG. 6D is a sectional side view of a device interfacing with an expansion card and mainboard according to an example.

FIG. 6D is a sectional side view of a device 600D interfacing with an expansion card 602D and mainboard 604D according to an example. The expansion card 602D has been inserted into card slot 606D and pivoted into place, and the fastener 630D is ready to be fastened into the mounting hole 605D of the mainboard 604D. The lower grip portion 614D is shown extending further into the expansion card 602D, which has a corresponding cutout to accommodate the lower grip portion 614D. Similarly, the upper grip portion 612D is shown extending into the correspondingly shallower expansion card cutout. Also visible is the shoulder 620D making contact with the expansion card 602D at the mechanical ground pad. Thus, the shoulder 620D provided electrical and thermal continuity between the ground pad of the expansion card 602D, and the metal insert of the mounting hole 605D of the mainboard 604D (and the fastener 630D, when secured in place). The fastener 630D may be secured to the mounting hole 605D, e.g., by screwing the threads to engage each other so that a head of the fastener is roughly flush with the opening in the top of the upper grip portion 612D.

Figure 7:
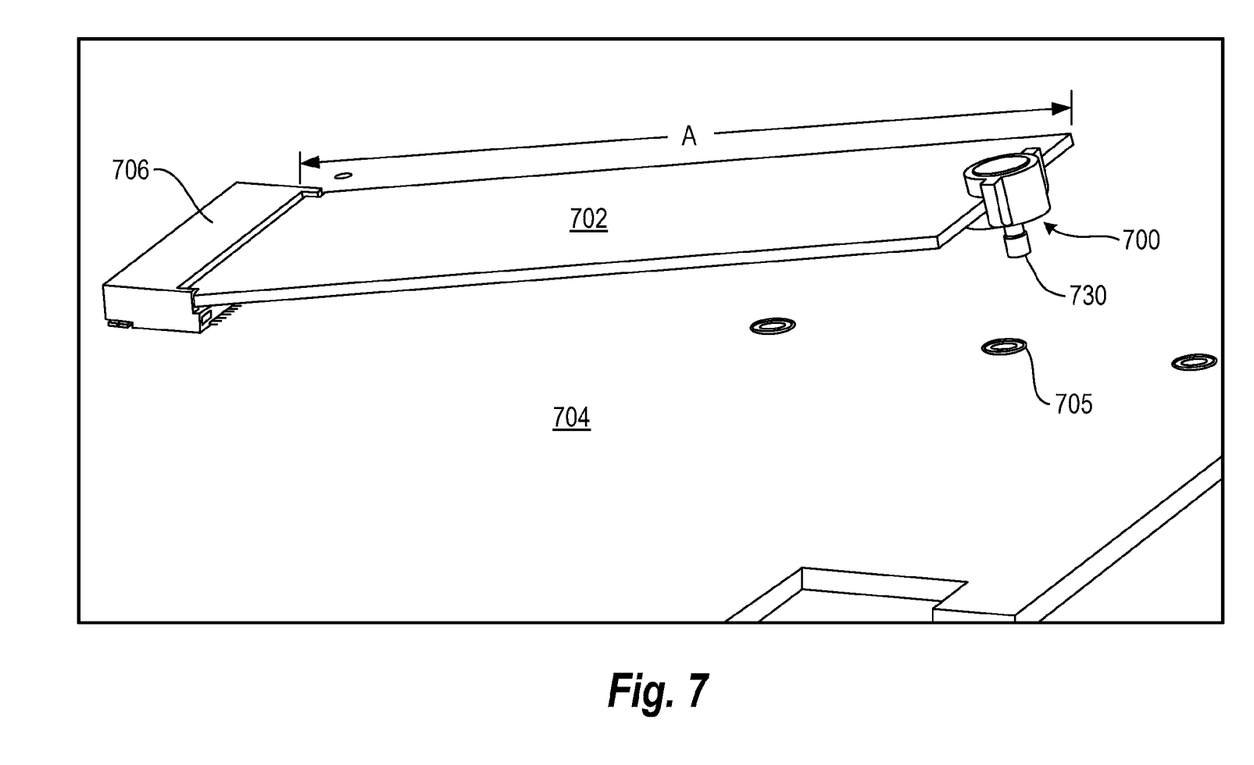
FIG. 7 is a perspective view of a device interfacing with an expansion card and mainboard according to an example.

FIG. 7 is a perspective view of a device 700 interfacing with an expansion card 702 and mainboard 704 according to an example. The expansion card 702 is shown having length A corresponding to a middle mounting hole 705 of the mainboard 704. Thus, when the expansion card 702 is inserted into the card slot 706, the device 700 aligns its fastener 730 with the middle mounting hole 705.

Because the device 700 provides standoff functionality, there is no need to include dedicated standoffs in the mainboard 704. Accordingly, the mounting holes 705 may remain approximately flush to the mainboard 704, and are prevented from interfering with the installation of the expansion card 702, regardless of its length. The device 700 may remain fixed to the expansion card 702, and may be removed as desired (e.g., for re-use with a different expansion card 702). Accordingly, waste is avoided because a single device 700 is used to accommodate various card lengths using corresponding mounting holes, without a need for multiple dedicated standoffs for each of the mounting holes.

What is claimed is:

1. A device comprising:
 a grip to secure the device to an expansion card based on a friction fit, wherein:
  the grip includes an upper grip portion to receive a fastener; and
  the grip allows a portion of the expansion card to extend into the device to create a thermal couple between the expansion card and a mainboard;
 a shoulder to retain the fastener in the device while enabling the fastener to be operable while retained in the device to fasten the device to the mainboard; and
 a standoff formed by a lower grip portion to establish a standoff distance between the expansion card and the mainboard when the device is secured to the expansion card and fastened to the mainboard.

2. The device of claim 1, wherein:
 the shoulder is rounded corresponding to supporting a fastening force generated by a head of the fastener; and
 the lower grip is rounded to accommodate the shoulder.

3. The device of claim 1, wherein the shoulder is to retain the fastener based on a captive orifice to receive a shaft of the fastener.

4. The device of claim 1, wherein the upper grip portion is spaced from the lower grip portion to enable the fastener to directly contact the expansion card.

5. The device of claim 1, further comprising a shelf at the grip to stabilize the fastener.

6. The device of claim 1, wherein the upper grip portion is a pronged extension.

7. The device of claim 1, wherein the upper grip portion is a rounded extension.

8. The device of claim 1, wherein the grip provides the friction fit based on a spring force between the upper grip portion and the lower grip portion.

9. The device of claim 1, further comprising an aligner extending laterally from the grip to orient the device relative to the expansion card based on contact with an edge of the expansion card.

10. The device of claim 1, wherein the device is to align the fastener at a distance from an edge of the expansion card corresponding to a mounting hole in the mainboard to receive the fastener.

11. The device of claim 1, wherein the shoulder is to contact the expansion card to provide heat transfer and electrical grounding between the expansion card and the mainboard.

12. A device comprising:
 a grip to secure the device to an expansion card based on a friction fit, wherein:
  the grip includes an upper grip portion to receive a fastener;
  the grip includes a shelf to stabilize the fastener; and
  the grip allows a portion of the expansion card to extend into the device to create a thermal couple between the expansion card and a mainboard; and
 a standoff formed by a lower grip portion to establish a standoff distance between the expansion card and the mainboard when the device is secured to the expansion card and fastened to the mainboard, wherein:
 the upper grip portion has first radius corresponding to an upper cutout of the expansion card; and
 the lower grip portion has a second radius corresponding to a lower cutout of the expansion card.

13. A device comprising:
 a grip to secure the device to an expansion card based on a friction fit, wherein:
  the grip includes an upper grip portion to receive a fastener; and
  the grip allows a portion of the expansion card to extend into the device to create a thermal couple between the expansion card and a mainboard; and a shoulder to retain the fastener while enabling the fastener to be operable while retained in the device to fasten the device to mainboard;

a standoff formed by a lower grip portion, to establish a standoff distance between the expansion card and the mainboard when the device is secured to the expansion card and fastened to the mainboard; and a fastener captively retained by a captive orifice of the shoulder.

14. The device of claim 13, wherein the fastener is captively retained based on a fastener shaft having a varying diameter.

15. The device of claim 13, wherein the fastener is captively retained while enabling the fastener a tolerance to slide along an axis of rotation of the fastener.

* * * * *